United States Patent [19]

Sugimoto et al.

[11] 4,032,799
[45] June 28, 1977

[54] AUTOMATIC GAIN CONTROL CIRCUIT

[75] Inventors: Takashi Sugimoto, Yokohama; Yoshio Wada, Tokyo, both of Japan

[73] Assignee: Tokyo Shibaura Electric Co., Ltd., Tokyo, Japan

[22] Filed: Mar. 2, 1976

[21] Appl. No.: 663,155

[30] Foreign Application Priority Data

Mar. 5, 1975   Japan .............................. 50-26037

[52] U.S. Cl. .......................... 307/264; 179 1 VL/; 307/296 R; 330/28; 330/29; 330/145
[51] Int. Cl.² ......................................... H03K 1/14
[58] Field of Search ............ 307/264, 235 J, 235 N, 307/237, 296; 328/168; 330/29, 145, 28; 179/1 VL

[56] References Cited

UNITED STATES PATENTS

| | | | |
|---|---|---|---|
| 3,790,896 | 2/1974 | Shimizu et al. | 307/264 |
| 3,840,756 | 10/1974 | Jones | 307/264 |
| 3,900,801 | 8/1975 | Furuno | 330/29 |

Primary Examiner—John Zazworsky
Assistant Examiner—Marcus S. Rasco
Attorney, Agent, or Firm—Finnegan, Henderson, Farabow & Garrett

[57] ABSTRACT

An automatic gain control circuit includes a first transistor whose base is supplied with an input signal and whose collector is impressed with a first source voltage through a first resistor and a second transistor whose collector is connected to the emitter of the first transistor, whose emitter is grounded and whose base is impressed with an automatic gain control voltage. The collector of the first transistor serves as an output terminal of the automatic gain control circuit. The automatic gain control circuit further includes a third transistor whose base is connected to the base of the second transistor and whose emitter is grounded and a fourth transistor whose emitter is connected to the collector of the third transistor, whose collector is connected to the base of the first transistor through a second resistor and is impressed with a second source voltage through a third resistor and whose base is connected to said collector through a fourth resistor.

6 Claims, 6 Drawing Figures

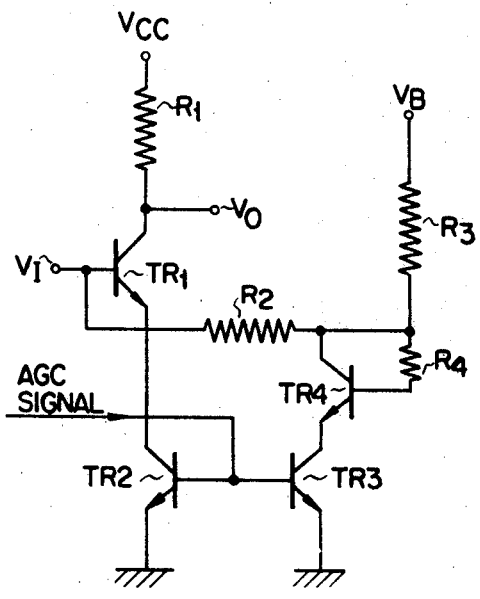
FIG. 1
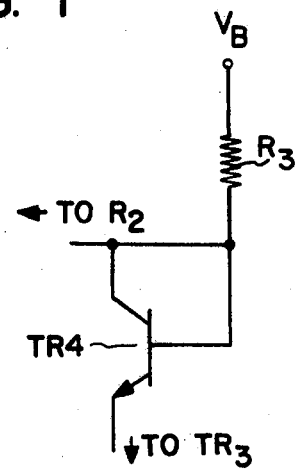
FIG. 4
FIG. 2
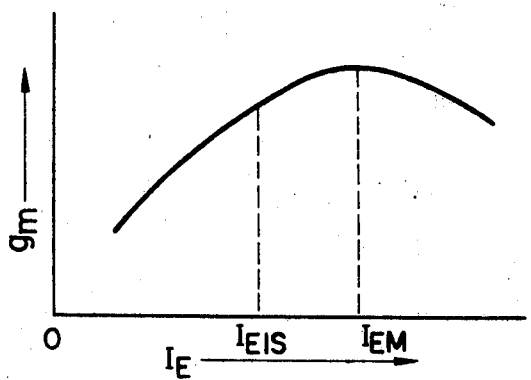
FIG. 3
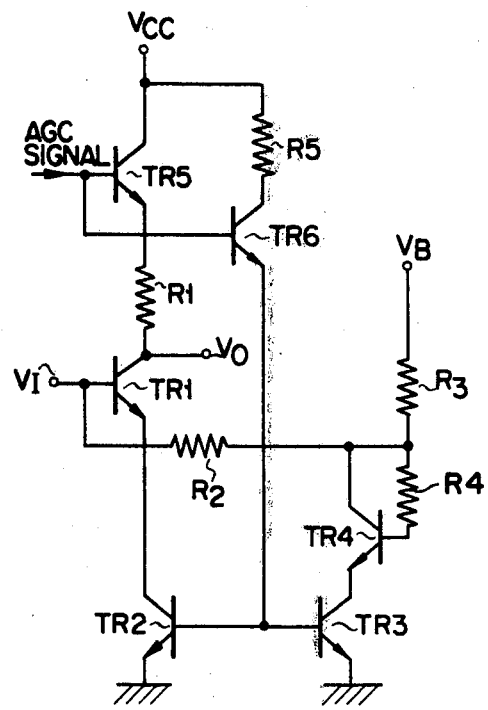

AUTOMATIC GAIN CONTROL CIRCUIT

BACKGROUND OF THE INVENTION

This invention relates to an automatic gain control circuit.

In recent years, a large variety of integrable automatic gain control circuits (hereinafter referred to as "AGC circuits") have been proposed as the result of development of integrated circuit techniques. The proposed methods of controlling the gain of a transistor circuit include, for example, the method of changing the emitter current of the transistor for conversion of its mutual conductance, the method of applying a negative feedback to the transistor circuit and the method of controlling voltage impressed across the collector and emitter of the transistor. However, any proposed AGC circuit has not been satisfactory and failed to carry out gain control over a fully broad range of an input signal whose voltage level is widely changed, presenting great difficulties in practical application.

SUMMARY OF THE INVENTION

It is accordingly the object of this invention to provide an AGC circuit capable of effecting gain control over a wide range.

According to an aspect of the invention, there is provided an AGC circuit which comprises a first transistor whose base is connected to receive an input signal, and whose collector is connected to receive a first source voltage through a first resistor; a second transistor whose collector is connected to the emitter of the first transistor, whose emitter is grounded and whose base is connected to receive an AGC voltage; a third transistor whose base is connected to the base of the second transistor, and whose emitter is grounded; a fourth transistor whose emitter is connected to the collector of the third transistor, whose collector is connected to receive a second source voltage through a second resistor and whose base is connected to the collector of said fourth transistor; and a third resistor connected between the base of the first transistor and the collector of the fourth transistor.

BRIEF DESCRIPTION OF THE DRAWING

FIG. 1 shows the arrangement of an automatic gain control circuit according to an embodiment of this invention;

FIG. 2 illustrates the relationship between the emitter current and mutual conductance of a transistor; and FIG. 3 presents the arrangement of an automatic gain control circuit according to another embodiment of the invention.

FIG. 4 presents a portion of the automatic gain control circuits of FIGS. 1 and 3 modified to short-circuit the base to the collector of transistor TR4.

DETAILED DESCRIPTION OF THE INVENTION

There will now be described by reference to the appended drawings an automatic gain control circuit according to the preferred embodiments of this invention.

With the AGC circuit of FIG. 1, a transistor TR1 has a base used as the input terminal $V_I$ of the AGC circuit and a collector used as the output terminal $V_0$ thereof. The collector of the transistor TR1 is impressed with a source voltage $V_{CC}$ through a resistor $R_1$. The emitter of the transistor TR1 is connected to the collector of a transistor TR2 whose emitter is grounded, and whose base is supplied with an AGC signal. This AGC signal is drawn out from the output terminal $V_0$ by ordinary technique and has its voltage decreased when the input terminal $V_I$ is supplied with an increased voltage and vice versa.

A transistor TR3 has its base connected to the base of the transistor TR2 and its emitter grounded. The collector of a transistor TR4 whose emitter is connected to the collector of the transistor TR3 is connected to the base of the transistor TR1 through a resistor $R_2$, and also is impressed with a source voltage $V_B$ through a resistor $R_3$. The base of the transistor TR4 is connected to the junction of the resistor $R_3$ and the collector of said transistor TR4 through a resistor $R_4$ having substantially the same resistance as the resistor $R_2$.

Where the input terminal $V_I$ is supplied with a low voltage, the AGC voltage is chosen to have a sufficiently large value to render the transistors TR2, TR3 saturated. Conversely where the input terminal $V_I$ is impressed with a high voltage, then the AGC voltage is set at a value small enough to make the transistors TR2, TR3 unsaturated.

There will now be described the operation of the AGC circuit of FIG. 1. Where the input terminal $V_I$ is impressed with a low voltage, both transistors TR2, TR3 become saturated by an AGC signal supplied to their bases, and the collector voltage of the transistor TR3 falls substantially to a zero volt. Since the base current of the transistor TR4 is as small as negligible, current $I_{E4}$ running thorough the transistor TR4 can be expressed as follows:

$$I_{E4} = (V_B - V_{BE4})/R_3$$

where:
$V_{BE4}$ = voltage of about 0.7v impressed across the base and emitter of the transistor TR4

In this case, the base of the transistor TR1 is maintained at the same potential as that of the transistor TR4. Since the transistors TR2, TR3 are saturated, the emitters of the transistors TR1, TR4 are brought to a zero volt. Accordingly, the base-emitter voltage of the transistor TR1 becomes equal to that of the transistor TR4. Current $I_{E1}$ flowing through the transistor TR1 is determined by the ratio of the emitter area of the transistor TR1 to that of the transistor TR4. Since, with the foregoing embodiment, the emitter area of the transistor TR1 is made equal to that of the transistor TR4, current $I_{E1}$ flowing through the transistor TR1 may be expressed as follows:

$$I_{E1} = I_{E4} = (V_B - V_{BE4})/R_3$$

Since $V_{BE4}$ stands at about 0.7v, the emitter current $I_{E1}$ of the transistor TR1 and the emitter current $I_{E4}$ of the transistor TR4 are determined by the source voltage $V_B$ and resistor $R_3$.

As apparent from FIG. 2 illustrating the relationship between the emitter current and mutual conductance of the transistor, current $I_{EIS}$ running through the transistor TR1 when the input terminal is impressed with a low voltage is smaller than the emitter current $I_{EM}$ giving a maximum mutual conductance.

Where the input terminal $V_I$ is impressed with an increased voltage, the AGC signal has a smaller amplitude, rendering the transistors TR2, TR3 unsaturated. The resultant decrease in current $I_{E2}$ and current $I_{E3}$ running through the transistors TR2, TR3 respectively lead to a decline in current $I_{E1}$ and current $I_{E4}$ flowing through the transistors TR1, TR4 respectively. The curve of FIG. 2 indicating the IE-gm characteristic shows that the mutual conductance $gm_1$ of the transistor TR1 falls with a decrease in current $I_{E1}$ introduced through said transistor TR1. When the transistor TR2 becomes unsaturated, the transistor TR2 disposed between the emitter of the transistor TR1 and the ground has an increased collector resistance $R_C$.

Amplification $A_V$ of the AGC circuit may be expressed as follows:

$$A_V = R_1/(r_e + R_c)$$

where:
$r_e$ = emitter resistance of the transistor TR1 which is chosen to be $1/gm_1$ Where the AGC signal decreases in amplitude, the transistor TR1 has a smaller mutual conductance $gm_1$ and a larger emitter resistance $r_e$, and the transistor TR2 has an increased collector resistance $R_e$, eventually resulting in the reduced amplification of the AGC circuit.

As described above, this invention is characterized in that when the voltage of the AGC signal changes with an input voltage, corresponding variation arises not only in the emitter resistance of the transistor TR1 but also in the collector resistance of the transistor TR2, attaining the broad range control of the gain of the AGC circuit. Even where, therefore, the voltage level of an input signal widely varies, it is possible to produce an output voltage whose level has been fully controlled, that is, a wide range of AGC can be attained.

FIG. 3 shows the arrangement of an AGC circuit according to another embodiment of this invention. The parts of the AGC circuit of FIG. 3 the same as those of FIG. 1 are denoted by the same numerals and detail description thereof is omitted.

The embodiment of FIG. 3 further comprises a transistor TR5 whose base is supplied with an AGC signal, whose collector is impressed with a source voltage $V_{CC}$ and whose emitter is connected to the resistor $R_1$, and another transistor TR6 whose base is supplied with an AGC signal, whose collector is impressed with a source voltage $V_{CC}$ and whose emitter is connected to the junction of the bases of the transistors TR2, TR3.

Where the input terminal $V_I$ is supplied with an input signal having a small amplitude, the AGC voltage is so set as to render the transistors TR6, TR2, TR3 saturated. The resistor $R_5$ is a protective resistor for preventing excess current from running through the transistor TR6 under the above-mentioned condition. In the case where an input signal supplied to the input terminal $V_I$ has a small amplitude, as described above, current conducted through the emitter of the transistor TR1 is chosen, as in FIG. 1, to be smaller than current $I_{EM}$, namely, is set at such a value as prevents the transistor TR1 from becoming saturated. At this time the transistor TR5 remains unsaturated.

Where the input terminal $V_I$ is supplied with an input signal having a larger amplitude, the AGC signal conversely decreases in amplitude, rendering the transistors TR6, TR2, TR3 unsaturated. As in FIG. 1, the transistor TR2 has an increased collector resistance $R_C$, and the transistor TR1 has a smaller mutual conductance gm, thereby attaining effective gain control. Further, as the AGC signal falls in amplitude, the emitter voltage of the transistor TR5 progressively decreases, resulting in a decline in the collector voltage of the transistor TR1. Thus, the transistor TR1 is gradually shifted to a saturated condition and its gain is decreased.

The second embodiment of FIG. 3 has a capacity effectively to control the gain of the AGC circuit by controlling the collector voltage of the transistor TR1 in addition to the advantageous effect realized in the first embodiment, thus sending forth an output signal whose gain has been fully controlled even with respect to an input signal whose voltage level widely varies.

It will be noted that this invention is not limited to the foregoing embodiments, but may be practised with a variety of modifications without departing from the object and scope of the invention. For example, it is possible in FIGS. 1 and 3 to short circuit the resistor $R_4$ and use the transistor TR4 as a diode as shown in FIG. 4. Further, if the collectors or emitters of the transistors TR2, TR3 or the emitter of the transistor TR6 of FIG. 3 is provided with a resistor, the characteristics of the AGC circuit of this invention will not be lost.

What we claim is:

1. An automatic gain control circuit comprising a first transistor whose base is connected to receive an input signal and whose collector is connected to receive a first source voltage through a first resistor; a second transistor whose collector is connected to the emitter of the first transistor, whose emitter is grounded and whose base is connected to receive an automatic gain control signal; a third transistor whose base is connected to the base of the second transistor, and whose emitter is grounded; a fourth transistor whose emitter is connected to the collector of the third transistor, whose collector is connected to receive a second source voltage through a second resistor and whose base and collector are connected to each other; and a third resistor connected between the base of the first transistor and the collector of the fourth transistor.

2. The automatic gain control circuit according to claim 1, wherein the base and collector of the fourth transistor are short-circuited with each other.

3. The automatic gain control circuit according to claim 1, wherein the base of the fourth transistor is connected to the junction of the collector of said fourth transistor and the second resistor through a fourth resistor having substantially the same resistance of the third resistor.

4. The automatic gain control circuit according to claim 1, having the first transistor whose base is connected to the junction of the collector of the fourth transistor and second resistor through the third resistor, which further comprises a fifth transistor whose collector is connected to receive the first source voltage, whose emitter is connected to the collector of the first transistor through the first resistor and whose base is connected to receive an automatic gain control signal; and a sixth transistor whose base is connected to the base of the fifth transistor, whose collector is connected to the collector of the fifth transistor through a fifth resistor and whose emitter is connected to the bases of the second and third transistor, whereby the automatic gain control signal is impressed on the bases of the second and third transistors through the sixth transistor.

5. The automatic gain control circuit according to claim 4, wherein the base and collector of the fourth transistor are short-circuited with each other.

6. The automatic gain control circuit according to claim 4, wherein the base of the fourth transistor is connected to the junction of the collector of said fourth transistor and second resistor through a fourth resistor having substantially the same resistance as the third resistor.

* * * * *